(12) United States Patent
Towle et al.

(10) Patent No.: US 6,888,240 B2
(45) Date of Patent: May 3, 2005

(54) HIGH PERFORMANCE, LOW COST MICROELECTRONIC CIRCUIT PACKAGE WITH INTERPOSER

(75) Inventors: Steven Towle, Phoenix, AZ (US); John Tang, Phoenix, AZ (US); Gilroy Vandentop, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/845,896

(22) Filed: Apr. 30, 2001

(65) Prior Publication Data

US 2002/0158335 A1 Oct. 31, 2002

(51) Int. Cl.$^7$ .................... H01L 23/34; H01L 23/48; H01L 23/52
(52) U.S. Cl. .................... 257/723; 257/724; 257/924; 257/778; 257/691; 257/698; 257/787; 257/777; 257/697
(58) Field of Search .................... 257/723, 724, 257/924, 778, 787, 691, 698, 697, 777, 702, 738, 780, 773

(56) References Cited

U.S. PATENT DOCUMENTS

| | | | |
|---|---|---|---|
| 5,048,179 A | 9/1991 | Shindo et al. | |
| 5,055,532 A | 10/1991 | Hoffman et al. | 525/528 |
| 5,105,257 A | 4/1992 | Michii | |
| 5,346,858 A | 9/1994 | Thomas et al. | 437/189 |
| 5,355,283 A | 10/1994 | Marrs et al. | 361/760 |
| 5,424,250 A | 6/1995 | Sawada | |
| 5,508,229 A | 4/1996 | Baker | |
| 5,523,622 A * | 6/1996 | Harada et al. | 257/734 |
| 5,608,262 A * | 3/1997 | Degani et al. | 257/723 |
| 5,701,032 A | 12/1997 | Fischer et al. | |
| 5,707,894 A | 1/1998 | Hsiao | 437/209 |
| 5,798,567 A * | 8/1998 | Kelly et al. | 257/723 |
| 5,864,470 A | 1/1999 | Shim et al. | |
| 5,870,822 A | 2/1999 | Drake et al. | |
| 5,892,287 A | 4/1999 | Hoffman et al. | 257/777 |
| 5,939,782 A | 8/1999 | Malladi | |
| 6,002,163 A | 12/1999 | Wojnarowski | 257/620 |
| 6,014,317 A * | 1/2000 | Sylvester | 361/760 |

(Continued)

FOREIGN PATENT DOCUMENTS

| | | | |
|---|---|---|---|
| EP | 0149317 | 11/1984 | |
| EP | 0361825 | 9/1989 | |
| EP | 0431205 A1 | 12/1989 | |
| EP | 0476971 | 3/1992 | ............ H01L/23/15 |
| EP | 0611129 | 8/1994 | ............ H01L/21/58 |
| EP | 0777274 | 6/1997 | ......... H01L/23/538 |
| EP | 0877419 | 11/1998 | ............ H01L/21/60 |
| EP | 1111662 | 6/2001 | ............ H01L/21/00 |
| GB | 2174543 | 11/1986 | ............ H01L/23/50 |
| JP | 62-004351 | 1/1987 | ............ H01L/23/48 |
| JP | 10125721 | 5/1998 | |
| JP | 11204688 | 7/1999 | |
| JP | 2000243870 | 9/2000 | |
| JP | 2000307005 | 11/2000 | |
| JP | 2000-349203 | 12/2000 | ............ H01L/23/28 |

*Primary Examiner*—Nitin Parekh
(74) *Attorney, Agent, or Firm*—Blakely, Sokoloff, Taylor & Zafman LLP

(57) ABSTRACT

A low cost technique for packaging microelectronic circuit chips fixes a die within an opening in a package core. At least one metallic build up layer is then formed on the die/core assembly and a grid array interposer unit is laminated to the build up layer. The grid array interposer unit can then be mounted within an external circuit using any of a plurality of mounting technologies (e.g., ball grid array (BGA), land grid array (LGA), pin grid array (PGA), surface mount technology (SMT), and/or others). In one embodiment, a single build up layer is formed on the die/core assembly before lamination of the interposer.

38 Claims, 7 Drawing Sheets

U.S. PATENT DOCUMENTS

| | | | |
|---|---|---|---|
| 6,025,275 A | | 2/2000 | Efland et al. |
| 6,049,465 A | * | 4/2000 | Blish, II et al. ............. 361/767 |
| 6,060,777 A | | 5/2000 | Jamieson et al. ........... 257/707 |
| 6,084,297 A | * | 7/2000 | Brooks et al. .............. 257/698 |
| 6,084,777 A | | 7/2000 | Kalidas et al. |
| 6,130,478 A | | 10/2000 | Dumoulin et al. |
| 6,154,366 A | | 11/2000 | Ma et al. |
| 6,162,652 A | | 12/2000 | Dass et al. .................... 438/18 |
| 6,204,074 B1 | | 3/2001 | Bertolet et al. |
| 6,222,246 B1 | | 4/2001 | Mak et al. |
| 6,239,482 B1 | | 5/2001 | Fillion et al. |
| 6,242,282 B1 | | 6/2001 | Fillion et al. |
| 6,262,579 B1 | | 7/2001 | Chazan et al. |
| 6,271,469 B1 | | 8/2001 | Ma et al. .................. 174/52.4 |
| 6,277,669 B1 | | 8/2001 | Kung et al. ................. 438/106 |
| 6,284,566 B1 | | 9/2001 | Lee et al. |
| 6,287,893 B1 | | 9/2001 | Elenius et al. ............... 438/108 |
| 6,291,775 B1 | | 9/2001 | Saitoh |
| 6,309,912 B1 | | 10/2001 | Chiou et al. ................ 438/118 |
| 6,316,830 B1 | | 11/2001 | Lin |
| 6,333,565 B1 | | 12/2001 | Hashimoto |
| 6,346,743 B1 | | 2/2002 | Figueroa et al. ............. 257/723 |
| 6,361,959 B1 | | 3/2002 | Beroz et al. ................... 435/14 |
| 6,388,333 B1 | * | 5/2002 | Taniguchi et al. .......... 257/777 |
| 6,590,291 B2 | | 7/2003 | Akagawa |
| 2001/0013654 A1 | | 8/2001 | Kalidas et al. |
| 2002/0008314 A1 | | 1/2002 | Takeuchi |
| 2002/0070443 A1 | | 6/2002 | Mu et al. .................... 257/712 |
| 2002/0158334 A1 | | 10/2002 | Vu et al. .................... 257/723 |

* cited by examiner

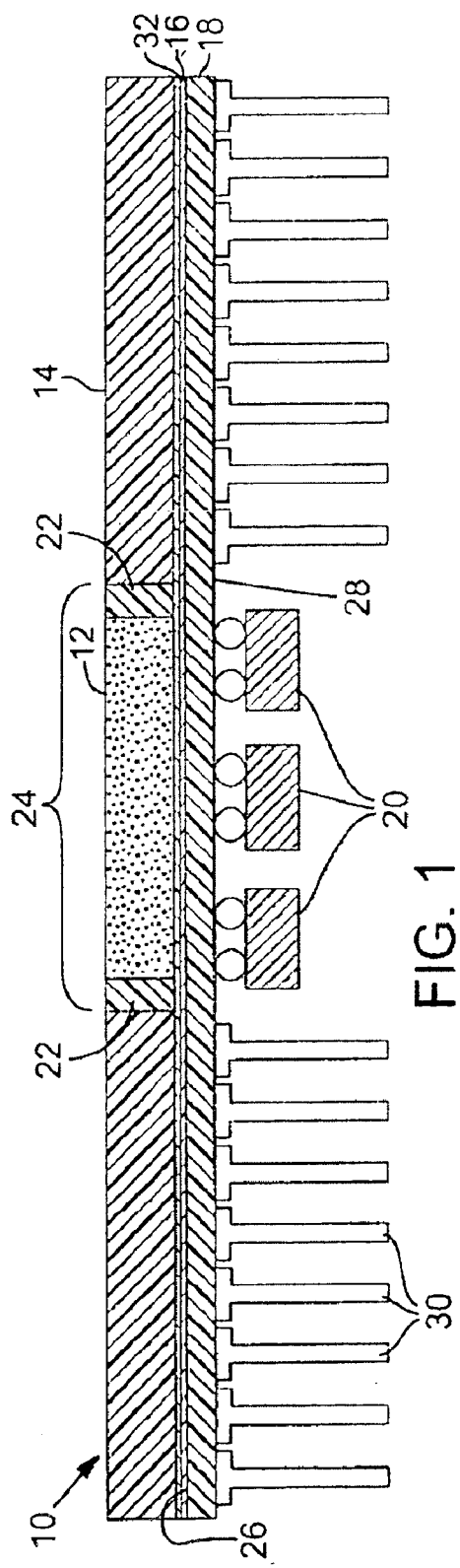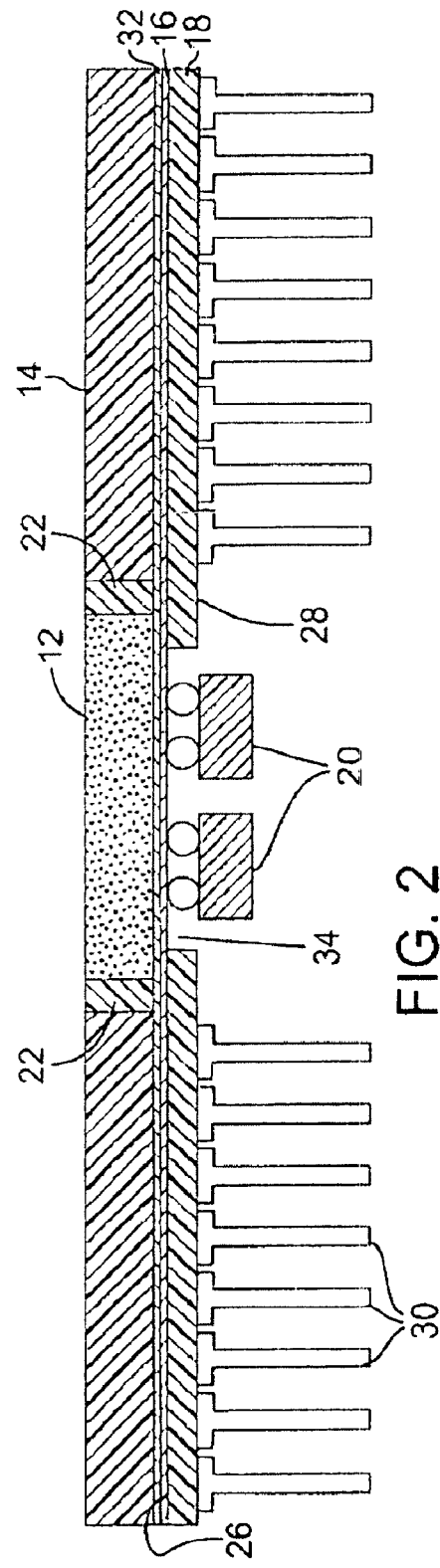

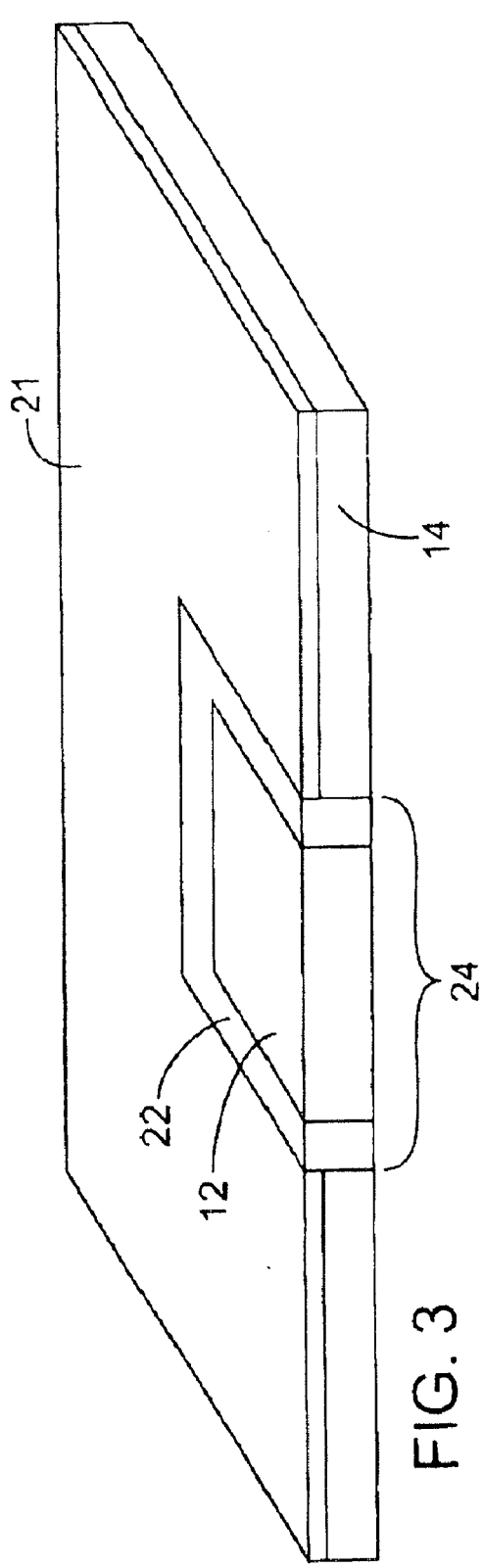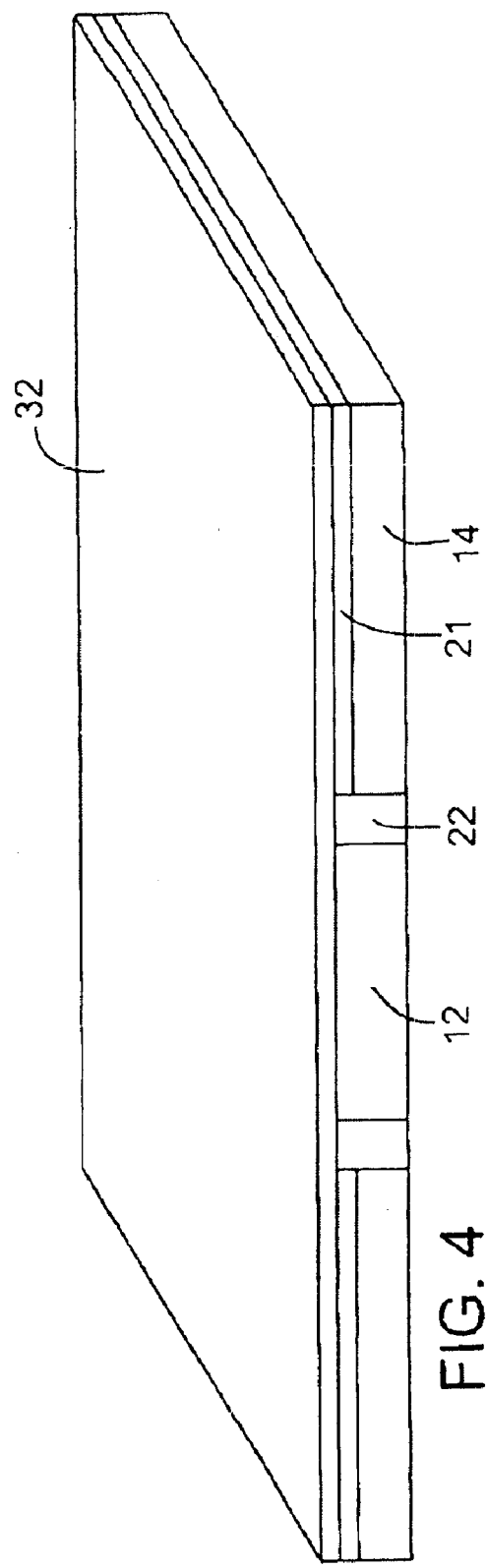

HIGH PERFORMANCE, LOW COST MICROELECTRONIC CIRCUIT PACKAGE WITH INTERPOSER

FIELD OF THE INVENTION

The invention relates generally to microelectronic circuits and, more particularly, to structures and techniques for packaging such circuits.

BACKGROUND OF THE INVENTION

After a microelectronic circuit chip (i.e., a die) has been manufactured, the chip is typically packaged before it is sold to the public. The package provides both protection for the chip and a convenient and often standardized method for mounting the chip within an external system. The circuit package must include some means for providing electrical communication between the various terminals of the circuit chip and the exterior environment. Many different packaging technologies have been used in the past for providing this communication. The type of package that is used for a particular chip can have a significant impact on the performance of the completed device. Typically, in a high volume manufacturing environment, cost will be a primary concern in selecting a packaging technology. Performance is also a very important criterion. As circuits get smaller and faster, there is an ongoing need for innovative and cost effective packaging technologies.

BRIEF DESCRIPTION OF THE DRAWINGS

FIG. 1 is a simplified cross sectional side view of a microelectronic device in accordance with one embodiment of the present invention;

FIG. 2 is a simplified cross sectional side view of a microelectronic device in accordance with another embodiment of the present invention;

FIG. 3 is a cross-sectional isometric view of the die/core assembly of FIG. 1 before a build up metallization layer is deposited;

FIG. 4 is a cross-sectional isometric view of the die/core assembly of FIG. 3 after a dielectric layer has been deposited;

DETAILED DESCRIPTION

Figure 5:
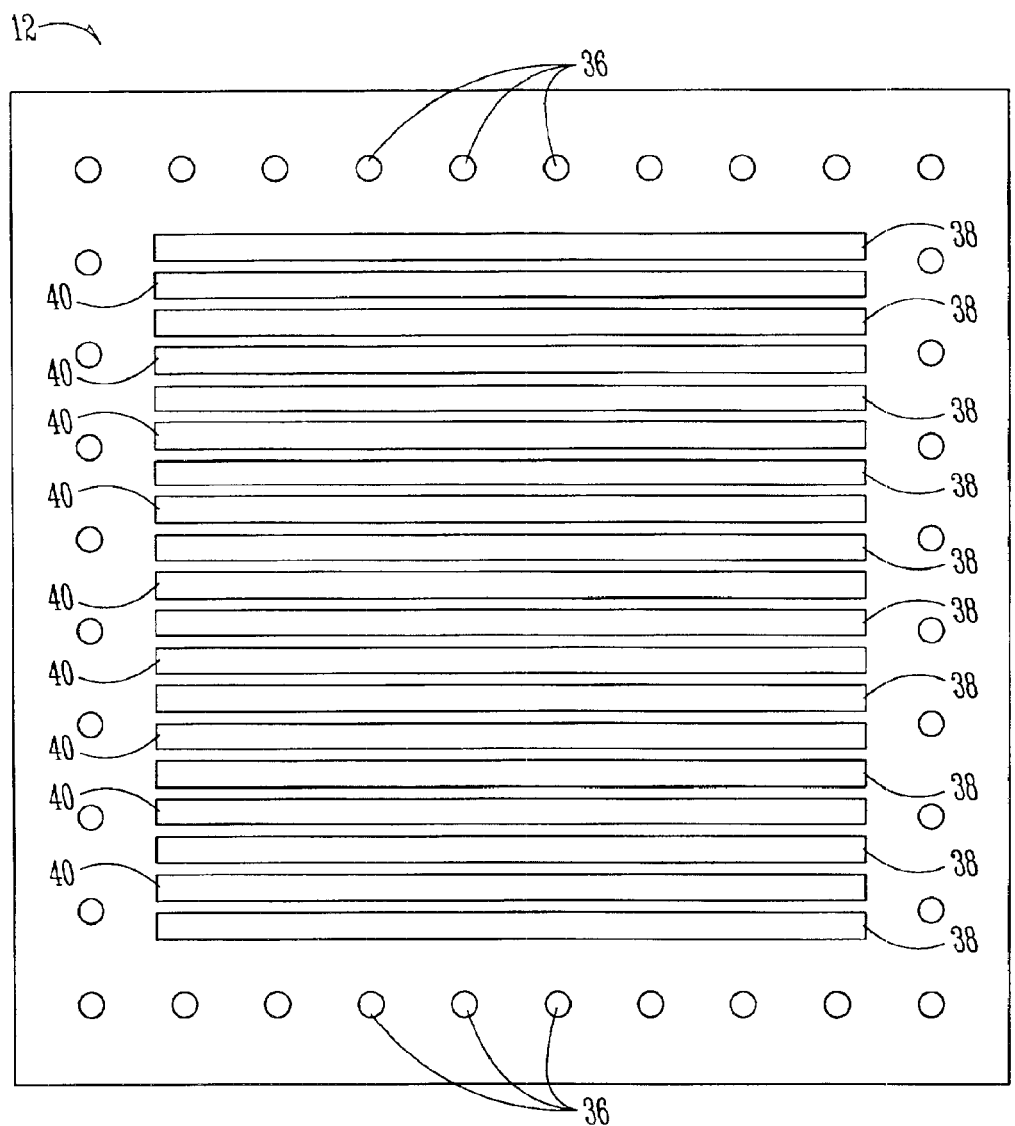
FIG. 5 is a schematic top view of a microelectronic die having a plurality of conductive contacts in accordance with one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to low cost structures and techniques for packaging microelectronic circuit chips. A die is fixed within an opening in a package core to form a die/core assembly. At least one metallic build up layer is then formed on the die/core assembly and a grid array interposer unit is laminated to the assembly. The grid array interposer unit includes an array of contacts that allow it to be mounted to an external circuit board using a corresponding mounting technique (e.g., ball grid array (BGA), land grid array (LGA), pin grid array (PGA), surface mount technology (SMT), and/or others). In one embodiment of the invention, one or more capacitors is mounted to a surface of the grid array interposer unit on a side opposite the die/core assembly to provide a de-coupling capacitance having relatively low series inductance for the circuitry of the die. In another embodiment, one or more capacitors are mounted directly to a metallization layer on the die/core assembly to provide a de-coupling capacitance having even lower series inductance. The techniques and structures of the present invention are capable of supporting high performance circuit operation and can thus be used to package high performance products, such as desktop and server segments. In addition, the inventive techniques and structures can provide this high performance operation at a relatively low cost compared to other high performance packaging schemes.

FIG. 1 is a simplified cross sectional side view of a microelectronic device 10 in accordance with one embodiment of the present invention. As illustrated, the device 10 includes: a microelectronic die 12, a package core 14, a build up metallization layer 16, a grid array interposer unit 18, and at least one de-coupling capacitor 20. The die 12 is fixed within an opening 24 in the package core 14 using an encapsulation material 22. As will be described in greater detail, the metallization layer 16 is built up upon the die/core assembly to provide escape routing and pitch expansion for contact structures on the die 12. In at least one embodiment, only a single build up metallization layer 16 is used (although multi-layer embodiments also exist). The grid array interposer unit 18 provides for electrical communication between the die/core assembly described above and an external circuit board (e.g., a computer motherboard). The grid array interposer unit 18 is laminated to the die/core assembly using any of a variety of different lamination techniques. The grid array interposer unit 18 has a metallization pattern on a first surface 26 thereof that is conductively coupled to the build up metallization layer 16 of the die/core assembly during the lamination process. The grid array interposer 18 also includes an array of conductive contacts on a second surface 28 thereof for subsequent connection to the external circuit board. The grid array interposer 18 can also include various intermediate metal layers between the first and second surfaces 26, 28 to perform, for example, additional routing functions or to provide a ground and/or power plane within the device 10. In one embodiment, the grid array interposer 18 is a relatively inexpensive (e.g., below $1 per unit), coarse pitch structure. In addition, the grid array interposer 18 will preferably be a relatively low profile structure (e.g., <0.5 millimeters(mm)) to allow reduced through hole pitch and minimal inductance for the de-coupling capacitors.

The metallization pattern on the first surface 26 of the grid array interposer 18 includes conductive portions that correspond to portions (e.g., landing pads) on the metallization layer 16 of the die/core assembly. During lamination, this metallization pattern is conductively coupled to the metallization layer 16 so that corresponding conductive elements are connected together. In one lamination technique, a solder mask is first patterned on the first surface 26 of the interposer 18 to define lands on the unit. Solder or conductive epoxy is then applied to the exposed land surfaces using a known technique (e.g., screen printing). The interposer 18 is then directly laminated to the metallization layer 16 in a known manner (e.g., solder reflow, ultrasonic bonding, etc.). In another technique, an anisotropically conductive film is used to attach the two structures. Some well known lamination processes that can be used include standard hydraulic lamination, vacuum assisted hydraulic lamination, autoclave, and mass lamination. As will be apparent to persons of ordinary skill in the art, other lamination techniques can also be used.

In one embodiment, a relatively simple two layer interposer unit 18 is used. The only routing within this interposer structure is from the landing pads on the first surface 26 of the unit to corresponding plated through holes and from the plated through holes to corresponding conductive contacts on the second surface 28. As will be appreciated, greater routing flexibility can be achieved by increasing the number of layers within the interposer 18.

As illustrated in FIG. 1, the de-coupling capacitors 20 are connected to the second surface 28 of the grid array interposer 18 in a region below the die 12. Because of the low profile of the package, capacitive de-coupling can be provided in this manner with relatively low series inductance. To achieve even less series inductance, the de-coupling arrangement of FIG. 2 can be implemented. In this embodiment, an opening 34 is provided in the interposer 18 that allows the de-coupling capacitors 20 to be mounted directly to the metallization layer 16 on the die/core assembly. Thus, the capacitors 20 can be mounted extremely close to the die 12 (e.g., less than 100 micrometers in one implementation) with the series inductance being correspondingly low. As will be described in greater detail, in at least one embodiment, a special landing pad configuration is provided within the metallization layer 16 to facilitate connection of the de-coupling capacitor(s) 20 to the metallization layer 16 below the die 12. It should be appreciated that the present invention does not require the connection of de-coupling capacitors to either the interposer 18 or the metallization layer 16. For example, in one embodiment of the invention, de-coupling capacitors are provided on the underside of the circuit board onto which the microelectronic device is mounted. Other de-coupling arrangements can also be used.

Any of a variety of techniques can be used to mount the microelectronic device 10 to an external circuit board. These techniques can include, for example, land grid array (LGA), ball grid array (BGA), or pin grid array (PGA) techniques. In the illustrated embodiment, an array of pins 30 is provided on the second surface 28 of the interposer 18 to provide connection to the external circuit board. In a preferred approach, the pins 30 are attached to the interposer 18 before the interposer 18 is laminated to the die/core assembly. In this manner, yield loss during the pin attach process does not result in the loss of known good die.

FIG. 3 is a cross-sectional isometric view of the die/core assembly of FIG. 1 before a build up metallization layer is deposited. To facilitate understanding of the build up process, the die/core assembly of FIG. 3 is inverted with respect to the structure of FIG. 1. As shown, the microelectronic die 12 is fixed within an opening 24 in the package core 14 using an encapsulation material 22. The microelectronic die 12 includes (electronic circuitry that is implemented on one or more internal layers. Although not shown in FIG. 3, a number of conductive contacts are distributed on the upper surface of the die 12 to provide an electrical interface to the circuitry of the die 12. The package core 14 can be formed from any of a variety of materials including, for example, bismaleimide triazine (BT) resin-based materials, flame retarding glass/epoxy materials (e.g., FR4), polyimide materials, ceramic materials, metal materials (e.g., copper), and others. A metal core material has the advantage that it will also serve as a heat spreader to facilitate heat removal from the die 12. In the illustrated embodiment, the package core 14 is formed from a dielectric board material (e.g., a BT board) having a conductive cladding 21 (e.g., copper foil) covering at least one surface thereof. In one embodiment, for example, a 0.725 mm thick board material having part number CCL-HL830 and manufactured by Mitsubishi Gas and Chemical Company is used to form the package core. As will be described in greater detail, the conductive cladding 21 can be used as a ground plane within the microelectronic device 10 to provide impedance control for transmission structures therein.

The opening 24 within the package core 14 can extend through the core 14 (as illustrated in FIG. 3) or a floor portion can be provided within the opening 24 to support the die 12 during packaging. The encapsulation material 22 can include any of a variety of materials that are capable of holding the die 12 within the core 14 including, for example, various plastics, resins, epoxies, elastomers, and the like. Preferably, the encapsulation material 22 will be non-conductive. In the illustrated embodiment, the upper surface of the die 12, the upper surface of the encapsulation material 22, and the upper surface of the core 14 are made substantially flush with one another. In another embodiment, the upper surface of the die 12 is higher than that of the core 14 and the encapsulation material 22 forms a layer above the core 14 that is flush with the upper surface of the die 12. Other arrangements for mounting the die 12 within the package core 14 can also be used.

After the die 12 has been fixed within the core 14, a layer of dielectric material 32 is deposited on the upper surface of the die/core assembly, as shown in FIG. 4. Any of a variety of different materials can be used for the dielectric layer 32 including, for example, glass particle filled epoxy resins (e.g., Ajinomoto Buildup Film (ABF) available from Ajinomoto), bisbenzocyclobutene (BCB) (available from Dow), polyimide, silicone rubber materials (e.g., DC6812 from DowCorning), various low-k dielectrics (e.g., SiLK from Dow Chemical), IPN (available from Ibiden), and others. A plurality of via holes (not shown) are formed through the dielectric layer 32 to expose portions of the contacts on the die 12. As will be described in greater detail, a metallization layer is then formed on the upper surface of the dielectric layer 32. The metallization layer includes a plurality of metallic elements that are each conductively coupled to corresponding contacts on the die 12 through one or more of the via holes. Additional layers (i.e., dielectric and metal) may then be built up over the first metallization layer in a similar manner. The uppermost metallization layer will include a metallization pattern that corresponds to the pattern on the first surface 26 of the interposer 18. As described above, in at least one embodiment, only a single metallization layer is built up upon the die/core assembly. This single metallization layer can be built up on panels mounted back to back, thus halving the build up cost. As will be appreciated, the use of a single metallization layer can reduce manufacturing costs significantly.

FIG. 5 is a top view of a microelectronic die 12 in accordance with one embodiment of the present invention. As shown, the die 12 includes a plurality of conductive contacts distributed on an upper surface thereof. That is, the die 12 includes a number of signal pads 36 within a peripheral region of its upper surface and a number of power and ground bars 38, 40 within a central region thereof. The signal pads 36 act as signal input/output (I/O) terminals for the circuitry of the die 12 (e.g., to transfer data or clock signals). In one approach, the signal pads 36 include short, wide copper bumps that cover the signal bond pad openings of the die 12 (using, for example, an alternative bump metallurgy (ABM) controlled collapse chip connection (C4) process). Other arrangements can also be used (e.g., the signal bond pad openings through the die passivation layer can be left uncovered). In the illustrated embodiment, a single row of signal pads 36 is provided on each side of the die 12. Other configurations, including multiple row configurations and random (non-aligned) configurations, can also be used.

The power and ground bars 38, 40 are arranged in an alternating pattern on the active surface of the die 12. In one approach, each of the power and ground bars 38, 40 includes a copper bar that links the power or ground bond pads of the die 12 in a particular row. Such bars can be formed, for example, as part of the C4 metallization. Each of the power bars 38 is coupled to circuit nodes within the die 12 that require application of a predetermined supply potential (e.g., $V_{DD}$) during circuit operation. Similarly, each of the ground bars 40 is coupled to circuit nodes within the die 12 that require a different supply potential (e.g., $V_{SS}$) during circuit operation. The number of signal pads 36, power bars 38, and ground bars 40 on the die 12 will typically depend upon the complexity and arrangement of the circuitry within the die 12. It should be appreciated that many alternative contact patterns can be used for the die 12 in accordance with the present invention and the particular pattern illustrated in FIG. 5 is not meant to be limiting.

Figure 6:
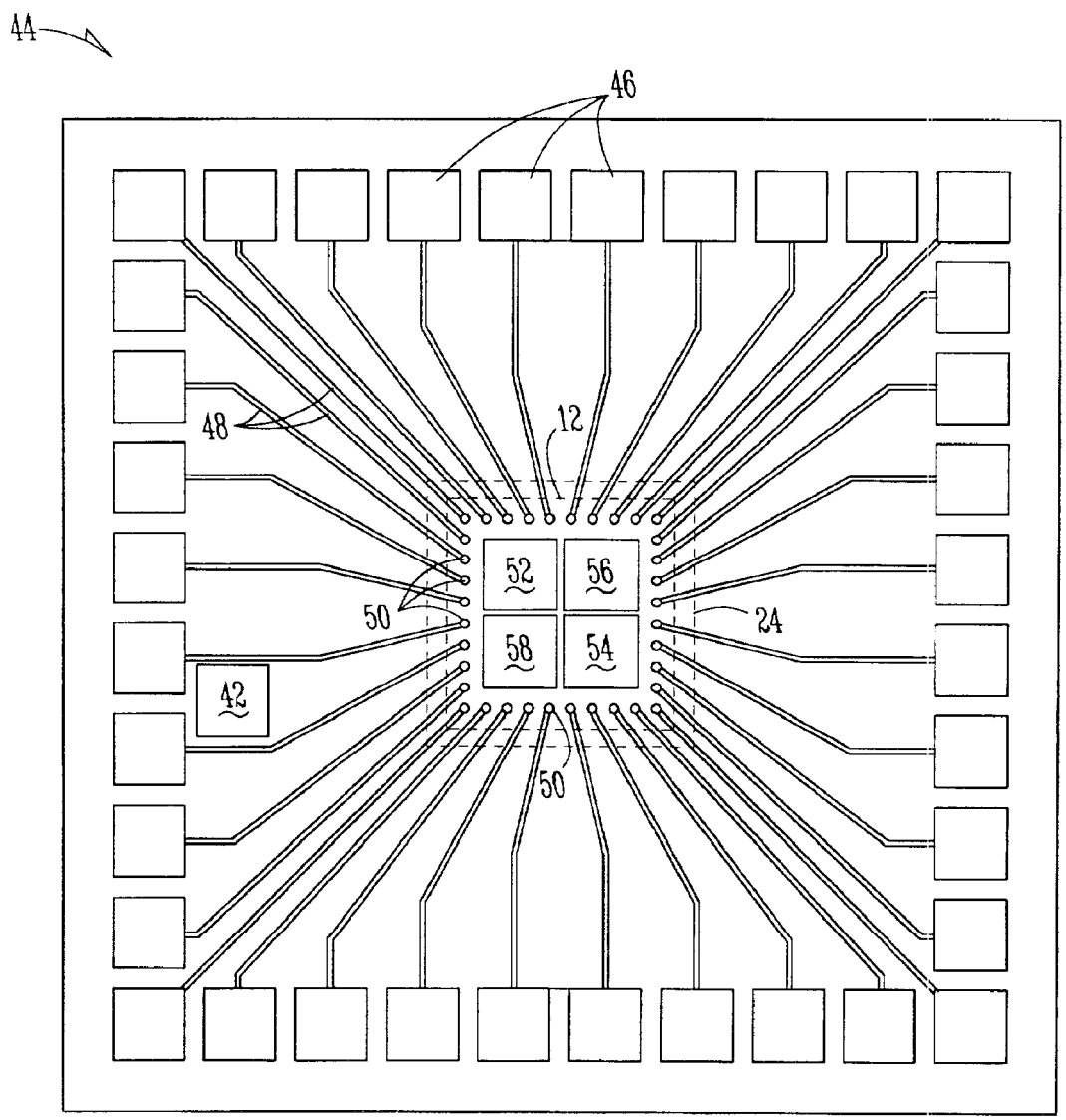
FIG. 6 is a schematic top view of a metallization pattern for a build up metallization layer in accordance with one embodiment of the present invention.

FIG. 6 is a top view of a metallization pattern 44 that is deposited on the dielectric layer 32 of the die/core assembly (see FIG. 4) in accordance with one embodiment of the present invention. This metallization pattern 44 forms a single metallization layer that is build up upon the die/core assembly to allow for direct connection (lamination) to the interposer 18. In FIG. 6, the outlines of the underlying die 12 and the opening 24 in the package core 14 are shown using hidden lines. As illustrated, the metallization pattern 44 includes a plurality of I/O landing pads 46 within a peripheral region thereof (i.e., above the package core) for use in coupling I/O signals to and from the interposer 18. The metallization pattern 44 also includes power landing pads 52, 54 and ground landing pads 56, 58 within a central region thereof (i.e., above the die 12) for use is making power and ground connections to the interposer 18. Both the I/O landing pads 46 and the power and ground landing pads 52, 54, 56, 58 have a pitch that is consistent with corresponding structures on the first surface 26 of the interposer 18. In the illustrated embodiment, the metallization pattern 44 includes two power landing pads and two ground landing pads. In general, it is desirable to use as many power and ground landing pads as is consistent with the pitch limitation of the device to minimize inductance. In the illustrated embodiment, the I/O landing pads 46 and the power and ground landing pads 52, 54, 56, 58 are square in shape. It should be appreciated, however, that any of a wide variety of shapes can be used including, for example, rectangular and circular shapes.

Each of the I/O landing pads 46 is conductively coupled to a corresponding signal pad 36 on the active surface of the die 12 (see FIG. 5) through a path including a transmission segment 48. The transmission segments 48 thus provide the "escape routing" for the signal connections of the die 12. Each transmission segment 48 is connected at a distal end to a terminal pad 50 within the metallization pattern 44 that is conductively coupled to the associated signal pad 36 on the die 12 through one or more via connections (e.g., microvias). The number of I/O signal connections that can be made within a particular microelectronic device will typically depend upon the density of transmission segments 48 that can be reliably implemented on the build up metallization layer. In at least one embodiment of the invention, multiple rows of I/O landing pads 46 are implemented within the build up metallization layer.

Figure 7:
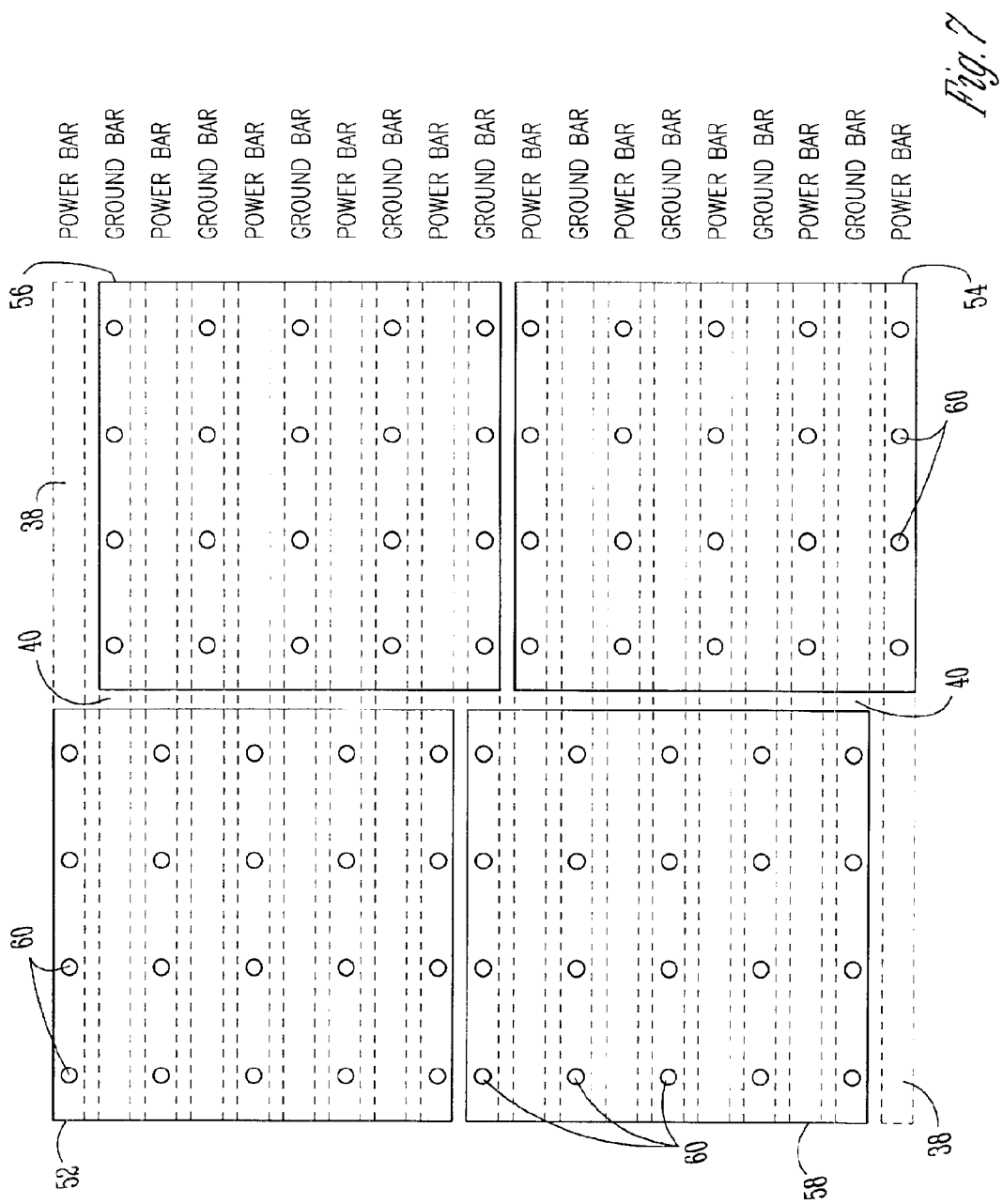
FIG. 7 is an enlarged schematic view of a central portion of the metallization pattern of FIG. 6 illustrating an arrangement of power and ground pads therein.

FIG. 7 is an enlarged view of the metallization pattern 44 of FIG. 6 in the vicinity of the power landing pads 52, 54 and the ground landing pads 56, 58. In FIG. 7, the power and ground bars 38, 40 on the underlying die 12 are shown using hidden lines. As illustrated, the power landing pads 52, 54 are each conductively coupled to multiple power bars 38 on the underlying die 12 using a plurality of via connections 60 that extend through the dielectric layer 32. Similarly, the ground landing pads 56, 58 are each conductively coupled to multiple ground bars 40 on the underlying die 12 using viaconnections 60. The number of power and ground bars 38, 40 that are encompassed by a power landing pad 52, 54 or a ground landing pad 56, 58 will normally depend upon the increase in pitch that is desired and the amount of series inductance that can be tolerated. The number of via connections 60 that are used in a particular implementation to couple a power or ground bar to a power or ground landing pad will usually depend upon the level of series resistance that can be tolerated and/or the maximum allowable current in the supply path.

Referring back to FIG. 6, the metallization pattern 44 may also include a ground pad 42 that is conductively coupled to the conductive cladding 21 of the underlying package core 14 through one or more via connections (or similar structures) in the dielectric layer 32. During package assembly, this ground pad 42 is conductively coupled to a corresponding ground structure on the interposer 18 that will be tied to ground when the microelectronic device 10 is mounted within an external circuit. The ground pad 42 can also be directly coupled to the ground of the die 12 by a trace portion (not shown) within the metallization pattern 44 that is connected to one or more ground bars 40 on the die 12 through via connections. In this manner, the conductive cladding 21 will be grounded during subsequent operation of the microelectronic device 10 and will serve as a ground plane beneath the metallization pattern 44. This ground plane allows transmission lines having a controlled impedance (e.g., microstrip lines) to be provided on the build up metallization layer (i.e., to form the transmission segments 48). In at least one embodiment, a second ground plane is provided on an intermediate layer of the interposer unit 18 that allows stripline transmission lines to be formed on the build up metallization layer. Among other advantages, controlled impedance lines are usually capable of significantly higher operational speeds than lines having a non-controlled impedance. Space providing, any number of ground pads 42 can be implemented as part of the build up metallization layer.

After the metallization pattern 44 has been deposited, a solder mask can be applied over the pattern 44 to mask areas that will not be connected to the interposer 18. The exposed areas can then be processed in accordance with the lamination method that will be used to attach the die/core assembly to the interposer 18. In an alternative approach, the solder mask could be patterned across the active surface and simultaneously act as an adhesive for attachment of the interposer. As described above, any of a number of different methods can be used to laminate the die/core to the interposer 18. Preferably, a lamination technique will be used that will accommodate any dimensional changes that might occur due to differences in the coefficient of thermal expansion between the various materials.

Figure 8:
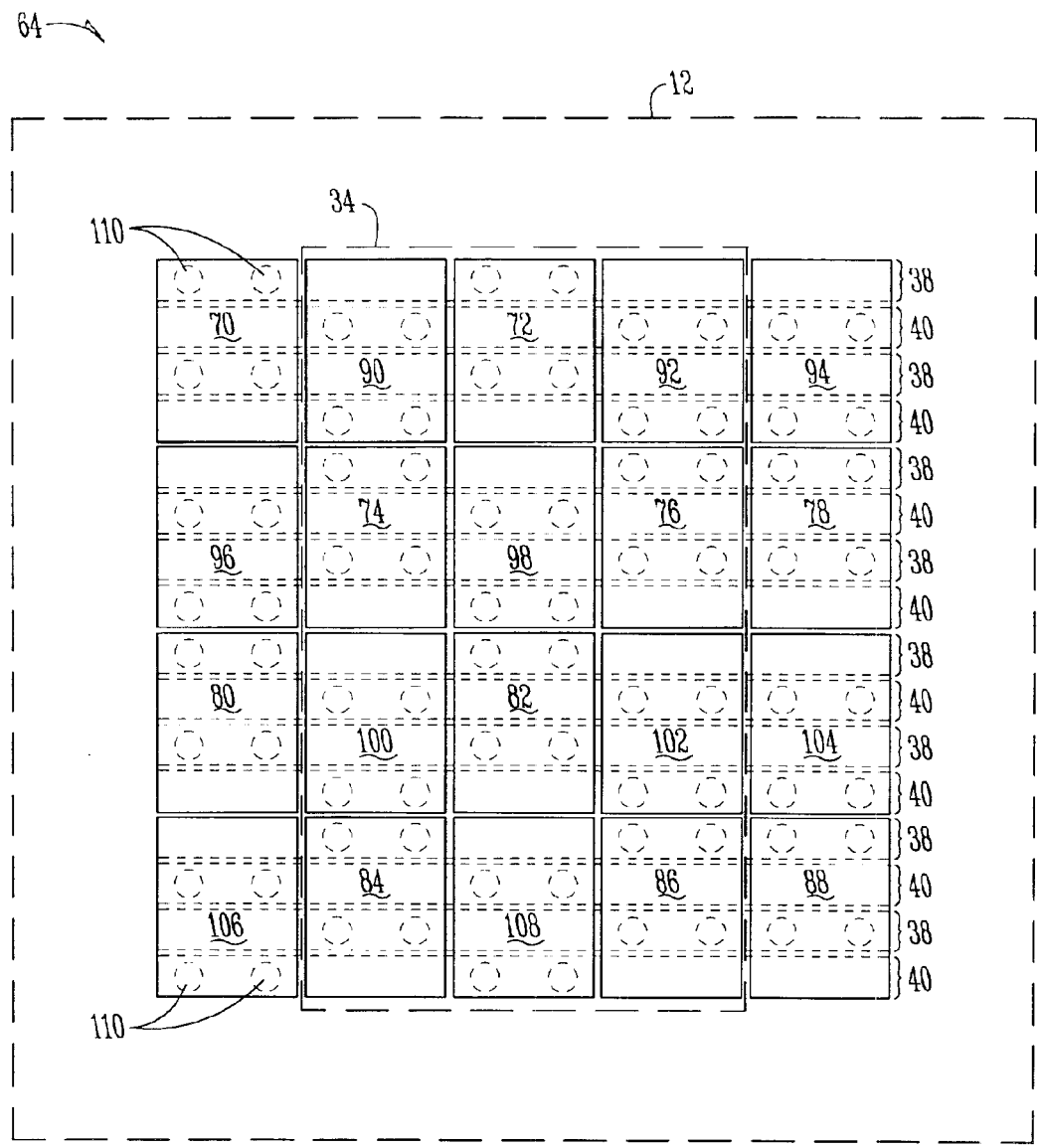
FIG. 8 is a schematic top view illustrating a portion of a metallization pattern in accordance with another embodiment of the present invention.

As described previously, the power and ground landing pads 52, 54, 56, 58 illustrated in FIGS. 6 and 7 will be conductively coupled to corresponding structures on the first surface 26 of the interposer 18 during package assembly. As can be appreciated, this will leave little or no room for attachment of de-coupling capacitors to the build up metallization layer in the region above the die 12. Thus, the metallization pattern 44 of FIGS. 6 and 7 is more appropriate for use in systems that do not attach the de-coupling capacitors directly to the die/core assembly (e.g., systems where the de-coupling capacitors are mounted to the second surface 28 of the interposer 18). FIG. 8 illustrates a portion of a metallization pattern 64 that allows direct mounting of the de-coupling capacitors to the metallization layer 16 of the die/core assembly. To simplify illustration and facilitate understanding, the outer portion of the metallization pattern 64 (i.e., the I/O portion) is not shown in FIG. 8. The outer portion, however, will typically be similar to that of the metallization pattern 44 of FIG. 6. The border of the underlying die 12 is shown in FIG. 8 using hidden lines. The power and ground bars 38, 40 on the underlying die 12 are also shown using hidden lines (the die 12 includes eight power bars 38 and eight ground bars 40). The opening 34 in the interposer unit 18 (see FIG. 2) is projected onto the metallization pattern 64 of FIG. 8 using a dotted line.

As illustrated in FIG. 8, the metallization pattern 64 includes a plurality of power landing pads 70, 72, 74, 76, 78, 80, 82, 84, 86, 88 and a plurality of ground landing pads 90, 92, 94, 96, 98, 100, 102, 104, 106, 108. As before, the power landing pads 70, 72, 74, 76, 78, 80, 82, 84, 86, 88 are each conductively coupled to multiple power bars 38 on the underlying die 12 using via connections 110 and the ground landing pads 90, 92, 94, 96, 98, 100, 102, 104, 106, 108 are each conductively coupled to multiple ground bars 40 on the underlying die 12 using via connections 110. The power and ground landing pads outside the boundary of the opening 34 (i.e., power landing pads 70, 78, 80, 88 and ground landing pads 94, 96, 104, 106) are used to make power and ground connections to the interposer 18, as described previously. The power and ground landing pads inside the boundary of the opening 34 (i.e., power landing pads 72, 74, 76, 82, 84, 86 and ground landing pads 90, 92, 98, 100, 102, 108) are used to connect de-coupling capacitors to the build up metallization layer. The de-coupling capacitors will preferably be mounted over the part of the die with the greatest demand for rapid delivery of power (e.g., the fireball). In one approach, one or more de-coupling capacitors are connected between each adjacent pair of power and ground landing pads within the opening 34. In another approach, an array capacitor is connected to multiple pads. As will be appreciated, other capacitor mounting configurations are also possible.

Figure 9:
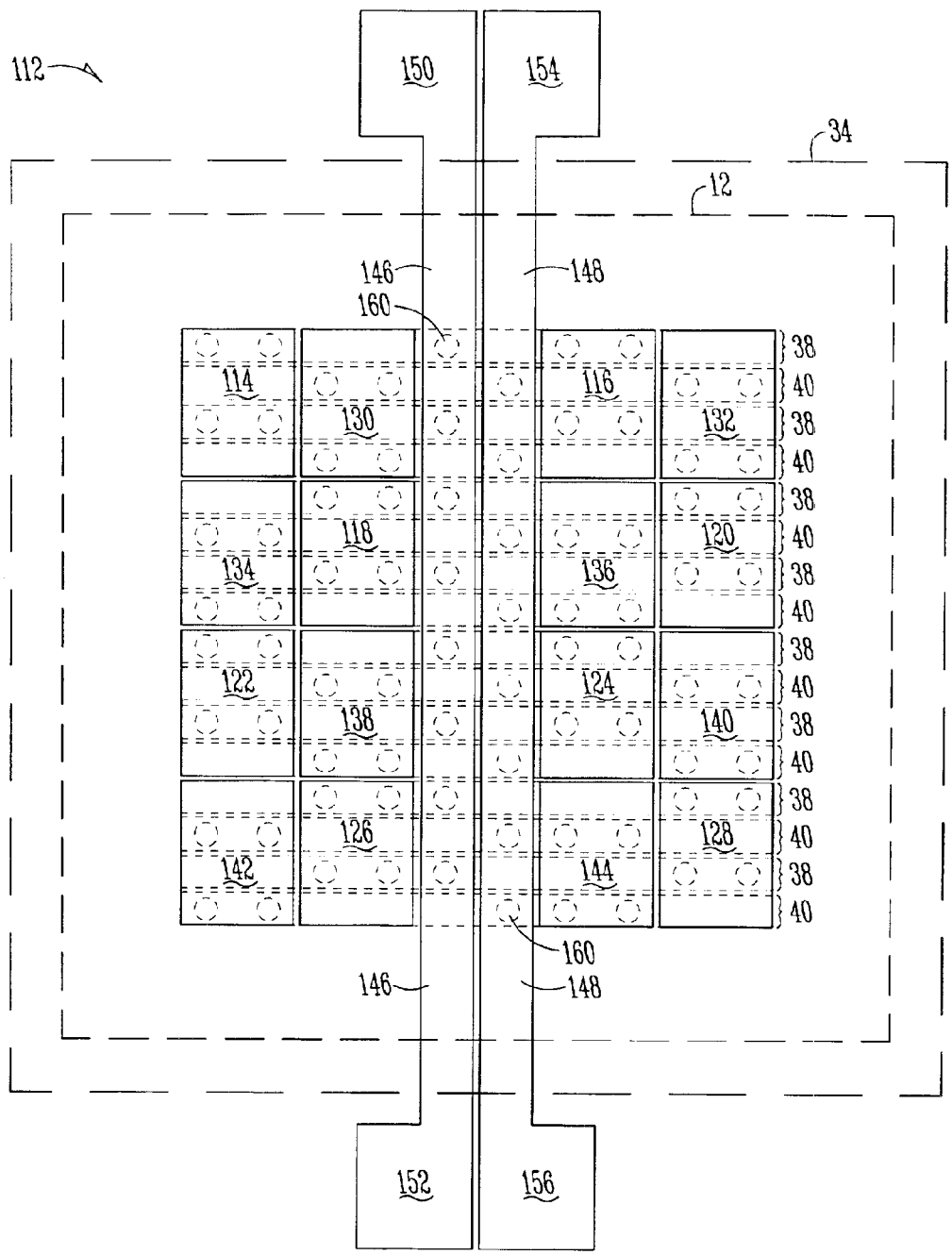
FIG. 9 is a schematic top view illustrating a portion of a metallization pattern in accordance with yet another embodiment of the present invention.

In the embodiment of FIG. 8, the opening 34 in the interposer 18 is smaller than the upper surface of the die 12. As the opening 34 in the interposer unit 18 gets larger, as would occur when more coupling capacitors are required, there is less space for power and ground landing pads above the die 12 for connection to the interposer 18. FIG. 9 illustrates a portion of a metallization pattern 112 that can be used when the opening 34 in the interposer 18 is too large to allow power and ground landing pads to be implemented above the die 12 for connection to the interposer 18. As shown, the metallization pattern 112 includes a plurality of power landing pads 114, 116, 118, 120, 122, 124, 126, 128 and a plurality of ground landing pads 130, 132, 134, 136, 138, 140, 142, 144 in a region above the die 12 and within the boundary of the opening 34. As before, these power and ground landing pads are used for connection of the de-coupling capacitors.

In addition, the metallization pattern 112 includes first and second traces 146, 148 that are used to conductively couple the power and ground bars 38, 40 on the die 12 to power and ground landing pads 150, 152, 154, 156 that are beyond the outer boundaries of the die 12 and the opening 34. In general, a plurality of such traces may be implemented in order to meet electrical requirements of the package, such as maximum current and loop inductance. The first trace 146 is connected to each of the power bars 38 on the underlying die 12 using via connections 160 and also to power landing pads 150 and 152. Similarly, the second trace 148 is connected to each of the ground bars 40 on the underlying die 12 using via connections 160 and also to ground landing pads 154 and 156. The power landing pads 150, 152 and the ground landing pads 154, 156 are to be conductively coupled to corresponding structures on the interposer 18 during the lamination process.

It should be appreciated that many alternative metallization patterns can be used for the build up metallization layer 16 of the die/core assembly in accordance with the present invention and the particular patterns illustrated in FIGS. 6, 7, 8, and 9 are not meant to be limiting. In addition, as described previously, microelectronic devices using multiple build up metallization layers on the die/core assembly can also be implemented. For example, a second build up layer can be used to increase the area available in the center region for de-coupling capacitors. Alternatively, a second build up layer can be used to provide additional ground structures for the transmission segments 48 (e.g., an upper ground plane for a strip line configuration). Also, a second build up layer can be used to provide additional flexibility in routing the I/O and power/ground traces. Other multiple layer configurations also exist.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A microelectronic device comprising:
a die having an active surface fixed within an opening in a package core by an encapsulation material between said die and said package core;
a metallization layer built up upon said active surface of said die and said package core; and
a grid array interposer unit having a first surface laminated to said metallization layer, said grid array interposer unit having an array of electrical contacts on a second surface thereof for connection to an external circuit board, wherein said grid array interposer unit includes an opening that exposes a first portion of said metallization layer, said microelectronic device further comprising at least one de-coupling capacitor connected to said first portion of said metallization layer to provide de-coupling for circuitry within said die.

2. The microelectronic device of claim 1, wherein:
said package core is formed from a dielectric board material having metallic cladding on at least one surface thereof.

3. The microelectronic device of claim 2, wherein:
said metallic cladding is conductively coupled to ground during operation of said device to provide a ground plane for at least one transmission structure within said metallization layer.

4. The microelectronic device of claim 2, wherein:
said metallic cladding is conductively coupled to a power source during device operation to form a power plane.

5. The microelectronic device of claim 2, wherein:
said metallization layer includes at least one ground pad that is conductively coupled to said metallic cladding on said package core through one or more via connections.

6. The microelectronic device of claim 1, wherein:
said active surface includes a plurality of power bars and a plurality of ground bars, each of said plurality of power bars being conductively coupled to multiple power bond pads of said die and each of said plurality of ground bars being conductively coupled to multiple ground bond pads of said die.

7. The microelectronic device of claim 6, wherein:
said plurality of power bars and said plurality of ground bars are interleaved within a central region of said active surface of said die.

8. The microelectronic device of claim 6, wherein:
said die includes a plurality of signal contact pads distributed within a peripheral region of said active surface.

9. The microelectronic device of claim 1, wherein:
said metallization layer includes at least one power landing pad situated over said die, said at least one power landing pad being conductively coupled to multiple power bond pads on said die through corresponding via connections.

10. The microelectronic device of claim 9, wherein:
said metallization layer includes at least one ground landing pad situated over said die, said at least one ground landing pad being conductively coupled to multiple ground bond pads on said die through corresponding via connections.

11. The microelectronic device of claim 1, wherein:
said metallization layer includes at least one power landing pad situated over said package core, said at least one power landing pad being conductively coupled to multiple power bond pads on said die through a trace portion extending over said die and a plurality of via connections.

12. The microelectronic device of claim 1, wherein:
said metallization layer includes at least one signal landing pad situated over said package core, said at least one signal landing pad being conductively coupled to a signal bond pad on said die through a path including a transmission line segment.

13. The microelectronic device of claim 1, wherein:
said microelectronic device includes a single metallization layer between said die and said grid array interposer unit.

14. An electrical system comprising:
a microelectronic device having:
a die/core assembly including a die fixed within an opening in package core by an encapsulation material between said die and said package core, said die/core assembly having a first surface including an active surface of said die;
a metallization layer built up over said first surface of said die/core assembly, said metallization layer having a first metallization portion over said die and a second metallization portion over said package core;
a grid array interposer unit laminated to said metallization layer, said grid array interposer unit having a first array of electrical contacts on a surface thereof; and
at least one capacitor conductively coupled to an exposed portion of said metallization layer to provide de-coupling for circuitry within said microelectronic die; and
a circuit board having a second array of electrical contacts, said grid array interposer unit being coupled to said circuit board so that contacts within said first array of electrical contacts are conductively coupled to corresponding contacts within said second array of electrical contacts.

15. The electrical system claimed in claim 14, wherein:
said circuit board is a computer motherboard.

16. The electrical system of claim 15, wherein:
said first array of electrical contacts includes a plurality of pins.

17. The electrical system of claim 15, wherein:
said first array of electrical contacts includes a plurality of solder balls.

18. A microelectronic device comprising:
a die/core assembly having a microelectronic die fixed within an opening in a package core by an encapsulation material between said die and said package core, said die/core assembly having including a first surface including an active surface of said die;
a metallization layer built up over said first surface of said die/core assembly, said metallization layer having a first metallization portion over said die and a second metallization portion over said package core;
a grid array interposer unit laminated to said metallization layer; and
at least one capacitor conductively coupled to an exposed portion of said metallization layer to provide de-coupling for circuitry within said microelectronic die.

19. The microelectronic device of claim 18, wherein:
said metallization layer includes at least one power landing pad situated over said microelectronic die that is conductively coupled to multiple power bond pads on said die and also to a corresponding power contact on said grid array interposer unit.

20. The microelectronic device of claim 18, wherein:

said metallization layer includes at least one power landing pad situated over said package core that is conductively coupled to multiple power bond pads on said die and also to a corresponding power contact on said grid array interposer unit.

21. A microelectronic device comprising:

a die having an active surface fixed within opening in a package core by an encapsulation material between said die and said package core;

a metallization layer built up upon said active surface of said die and said package core, wherein said metallization layer includes a first metallization portion located over said die and a second metallization portion located over said package core; and a grid array interposer unit having a first surface laminated to said metallization layer, said grid array interposer unit having an array of electrical contacts on a second surface thereof for connection to an external circuit board, and wherein said grid array interposer unit has a thickness between said first and second surfaces that is no greater than 0.5 millimeters and said grid array interposer unit includes an opening that exposes a first portion of said metallization layer, said microelectronic device further comprising at least one de-coupling capacitor connected to said first portion of said metallization layer to provide de-coupling for circuitry within said die.

22. The microelectronic device of claim 21, wherein:

said metallization layer includes at least one ground pad that is conductively coupled to said metallic cladding on said package core through one or more via connections.

23. A microelectronic device comprising:

a die having an active surface fixed within a package core;

a metallization layer adjacent to said active surface of said die and said package core;

a grid-array interposer unit having a first surface laminated to said metallization layer, said grid array interposer unit having an array of electrical contacts on a second surface thereof for connection to an external circuit board; and a dielectric layer between said metallization layer and said active surface of said die and said package core.

24. The microelectronic device of claim 23, wherein:

said metallization layer is conductively coupled to said active surface of said die through via connections in said dielectric layer.

25. The microelectronic device of claim 23, wherein:

said metallization layer includes ate least one I/O landing pad to said active surface of said die by a transmission line segment.

26. A microelectronic device comprising:

a die/core assembly including a die fixed within a package core, said die/core assembly having a continuous surface;

a metallization layer built up upon said continuous surface; and a grid array interposer unit having a first surface laminated to said metallization layer, said grid array interposer unit having an array of electrical contacts on a second surface thereof for connection to an external circuit board.

27. The microelectronic device of claim 26, wherein:

said die is fixed within said package care by an encapsulation material between said die and said package core.

28. The microelectronic device of claim 27, wherein:

said package core includes an opening that extends through said package core.

29. The microelectronic device of claim 26, wherein:

said continuous surface comprises a dielectric layer.

30. The microelectronic device of claim 28, wherein:

said metallization layer is conductively coupled to said active surface of said die through via connections in said dielectric layer.

31. The microelectronic device of claim 26, wherein:

said package core comprises a metallic cladding on at least one surface thereof.

32. The microelectronic device of claim 31, wherein:

said metallic cladding is conductively coupled to ground during device operation to provide a ground plane.

33. The microelectronic device of claim 31, wherein:

said metallic cladding is conductively coupled to a power source during device operation to provide a power plane.

34. The microelectronic device of claim 26, wherein:

said metallization layer includes a power landing pad situated over said die, said power landing pad being conductively coupled to a power bond pad on said die through a via connection.

35. The microelectronic device of claim 26, wherein:

said metallization layer includes a ground landing pad situated over said die, said ground landing pad being conductively coupled to a ground bond pad on said die through a via connection.

36. The microelectronic device of claim 26, wherein:

said metallization layer includes a signal landing pad situated over said package core, said signal landing pad being conductively coupled to a signal bond pad on said die through a transmission line segment.

37. The microelectronic device of claim 26, further comprising:

a de-coupling capacitor connected to said second surface of said grid array interposer unit to provide de-coupling for circuitry within said die.

38. The microelectronic device of claim 26, further comprising:

a circuit board having a second array of electrical contacts, wherein said grid array interposer unit is conductively coupled to said circuit board.

* * * * *

UNITED STATES PATENT AND TRADEMARK OFFICE
CERTIFICATE OF CORRECTION

PATENT NO. : 6,888,240 B2  
DATED : May 3, 2005  
INVENTOR(S) : Towle et al.

It is certified that error appears in the above-identified patent and that said Letters Patent is hereby corrected as shown below:

Column 11,
Line 54, delete "ate" and insert -- at --.

Signed and Sealed this

Twelfth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,888,240 B2
DATED : May 3, 2005
INVENTOR(S) : Towle et al.

It is certified that error appears in the above-identified patent and that said Letters Patent is hereby corrected as shown below:

Column 9,
Line 20, before "metallic" insert -- a --.

Column 10,
Line 17, after "in" insert -- a --.

Column 12,
Line 10, delete "care" and insert -- core --.

Signed and Sealed this

Fourth Day of October, 2005

JON W. DUDAS
*Director of the United States Patent and Trademark Office*